United States Patent [19]

Cheung

[11] Patent Number: 5,693,566
[45] Date of Patent: Dec. 2, 1997

[54] LAYERED LOW DIELECTRIC CONSTANT TECHNOLOGY

[75] Inventor: Robin W. Cheung, Cupertino, Calif.

[73] Assignee: Advanced Micro Devices, Inc., Sunnyvale, Calif.

[21] Appl. No.: 459,957

[22] Filed: Jun. 2, 1995

Related U.S. Application Data

[62] Division of Ser. No. 330,871, Oct. 28, 1994, Pat. No. 5,534,731.

[51] Int. Cl.$^6$ .................................................. H01L 21/441
[52] U.S. Cl. ........................ 437/195; 437/228; 437/235; 437/238
[58] Field of Search ..................... 437/195, 228, 437/235, 238; 156/653.1

[56] References Cited

U.S. PATENT DOCUMENTS

| | | | |
|---|---|---|---|
| 4,676,867 | 6/1987 | Elkins et al. | 156/643 |
| 4,974,055 | 11/1990 | Haskell | 357/71 |
| 4,977,108 | 12/1990 | Haskell | 437/229 |
| 5,028,555 | 7/1991 | Haskell | 437/57 |
| 5,043,789 | 8/1991 | Linde et al. | 357/52 |
| 5,055,427 | 10/1991 | Haskell | 437/203 |
| 5,057,902 | 10/1991 | Haskell | 357/71 |
| 5,081,516 | 1/1992 | Haskell | 357/42 |
| 5,250,468 | 10/1993 | Matsuura et al. | 437/194 |
| 5,374,833 | 12/1994 | Nariani et al. | 257/52 |
| 5,435,888 | 7/1995 | Kalnitsky et al. | 216/18 |
| 5,441,765 | 8/1995 | Ballance et al. | 427/228 |

FOREIGN PATENT DOCUMENTS

| | | |
|---|---|---|
| 03-196663 | 8/1991 | Japan. |
| 05-29481 | 2/1993 | Japan. |

*Primary Examiner*—John Niebling
*Assistant Examiner*—C. Everhart

[57] ABSTRACT

A layered dielectric structure is provided, which separates a first layer of metal interconnects from each other in semiconductor devices and also separates the first layer from a second, overlying layer of metal interconnects for making electrical contact to the first layer of metal interconnects. The layered dielectric structure comprises: (a) a layer of an organic spin-on-glass material filling gaps between metal interconnects in the first layer of metal interconnects; (b) a layer of an inorganic spin-on-glass material to provide planarization to support the second layer of metal interconnects; and (c) a layer of a chemically vapor deposited oxide separating the organic spin-on-glass layer and the inorganic spin-on-glass layer. The layered dielectric structure provides capacitances on the order of 3.36 to 3.46 in the vertical direction and is about 3.2 in the horizontal direction. This is a reduction of 10 to 15% over the prior art single dielectric layer, using existing commercially available materials.

14 Claims, 1 Drawing Sheet

LAYERED LOW DIELECTRIC CONSTANT TECHNOLOGY

This is a division of application Ser. No. 08/330,871 filed, Oct. 28, 1994 now U.S. Pat. No. 5,534,731.

TECHNICAL FIELD

The present invention relates generally to metal interconnects employed in semiconductor technology, and, more particularly, to fabricating sub-micrometer metal interconnects with a reduction in capacitance.

BACKGROUND ART

The semiconductor industry has been relying on the aluminum-silicon dioxide-based system for the last 30 years. With the ever-increasing demand on performance, this system appears to be inadequate to support the future requirements. Low dielectric constant technologies, the best material of which is air itself, have been proposed to give a breath of life to the aluminum-based system. Some proposals to switch the conductor system from aluminum-based to copper-based have been made.

Most of the proposed solutions work well on computer modeling and on paper. The discussion here will concentrate on the practical aspects of the technology. The main issues addressed are: Time to market, cost of implementation, and return on investment.

The information and entertainment industries provide the driving force for the ever increasing performance enhancement requirements on integrated circuit designers and manufacturers. The industry work-horse, the aluminum-silicon dioxide system, appears to be running out of steam to support those stringent requirements. Customers are requesting higher performance and higher reliability. Based on the summary on the performance of various systems shown in Table 1, it is clear that it will be important to move away from the basic Al-SiO$_2$ system to gain performance. Table 1 lists the relative RC time delay of various metal dielectric systems.

TABLE 1

Relative Performance of Various Systems

| Metal-Dielectric System | Relative RC Delay |
|---|---|
| Al—SiO$_2$ | 1.0 |
| Al-k = 2 | 0.5 |
| Cu—SiO$_2$ | 0.67 |
| Cu-k = 2 | 0.31 |
| Al-k = 3.2 | 0.8 |
| Al-k = 3.5 | 0.88 |

The best system proposed is an air-gap (air bridge) metalization system, since the relative dielectric constant of air is 1. This will provide the best RC delay that can possibly be obtained. However, this system will be difficult to manufacture and difficult to ensure quality.

In order to maintain the optimum RC delay, it is necessary to reduce capacitance. However, reducing the spacing between metal interconnects results in an increase in capacitance. Thus, a scheme is required that will enable fabrication of submicrometer metal interconnects while maintaining optimum RC delay.

DISCLOSURE OF INVENTION

In accordance with the invention, a layered dielectric structure is provided, which separates a first layer of metal interconnects from each other in semiconductor devices and also separates the metal interconnects from a second, overlying layer of metal interconnects for making electrical contact to the first layer of metal interconnects. The layered dielectric structure comprises:

(a) a layer of an organic spin-on-glass material filling gaps between the first layer of metal interconnects;

(b) a layer of an inorganic spin-on-glass material to provide planarization to support the second layer of metal interconnects; and (c) a layer of a chemically vapor deposited (CVD) oxide separating the organic spin-on-glass layer and the inorganic spin-on-glass layer.

If multiple layers of inorganic/organic spin-on-glass materials are used to provide local and global planarity, a CVD layer is deposited to separate each such layer to provide structural support.

The layered dielectric structure provides a dielectric constant on the order of 3.36 to 3.46 in the vertical direction and about 3.2 in the horizontal direction. This is a reduction of 10 to 15% over the prior art single dielectric layer, using existing commercially available materials.

Other objects, features, and advantages of the present invention will become apparent upon consideration, of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

The sole FIGURE is a cross-sectional view of the layered dielectric structure of the invention, illustrating the device up through the second interconnect layer.

BEST MODES FOR CARRYING OUT THE INVENTION

Figure 1:
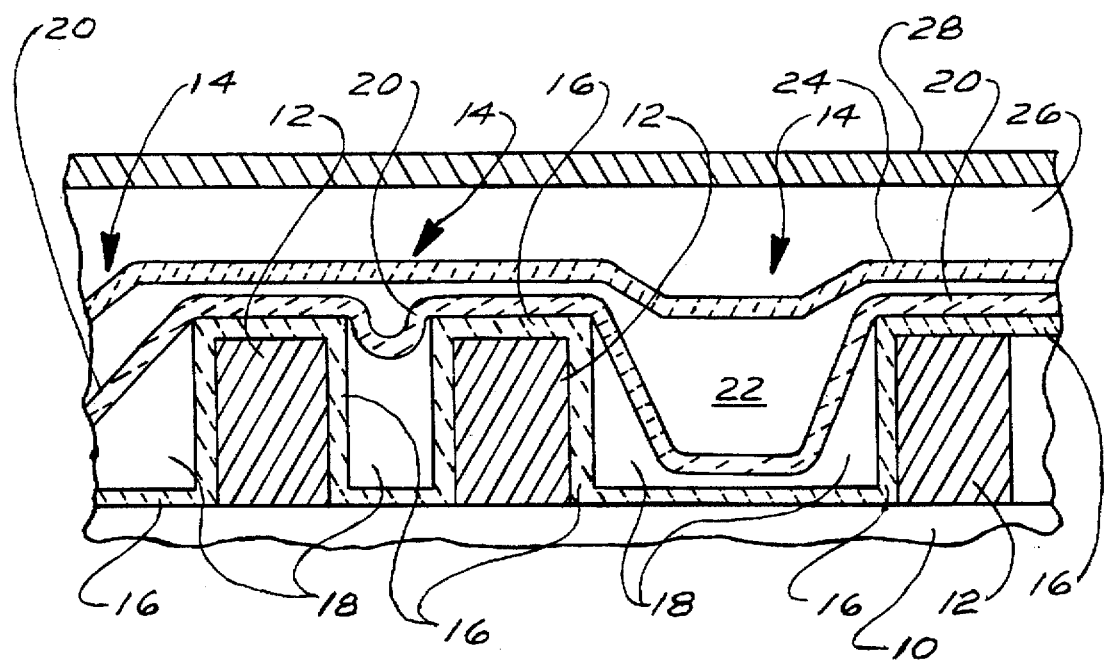

Reference is now made in detail to a specific embodiment of the present invention, which illustrates the best mode presently contemplated by the inventor for practicing the invention. Alternative embodiments are also briefly described as applicable.

In accordance with the invention, both the organic and inorganic type spin-on-glass (SOG) materials are used in conjunction with chemically vapor deposited (CVD) oxide in the process of fabricating semiconductor devices. The organic SOG is basically the polysiloxane that is presently used in the production of semiconductor devices, such as Allied 111. However, any of the polysiloxanes commonly employed in the processing of semiconductor devices may be employed. The older materials, such as Allied 111, are all relatively high dielectric constant materials.

Newer organic siloxane SOG materials, available from both Allied Chemical and Hitachi Chemical, evidence relatively low dielectric constant (about 2.6). These new materials are called silsesquioxanes; the Allied Chemical designation is XT-15, while the Hitachi Chemical designation is HSG-2209S-K7. The silsesquioxanes have methyl, ethyl, butyl, or other alkyl functionalities to achieve a higher concentration of carbon than the older organic SOG materials. Because of the higher carbon concentration, these materials cannot be exposed during the opening of vias, since the $O_2$ plasma used to remove photoresist during formation of the vias oxidizes the carbon and creates discontinuities in aluminum-containing interconnects. Thus, very special care is needed if the material is exposed during via opening. Carelessness will lead to poisoned vias. On the other hand, these new materials possess good gap-filling qualities and can fill between metal spaces.

Etch-back of the SOG material is required after furnace-curing to guarantee that no SOG material remains on top of any high spots. The etch-back could be very brief, and is calculated to remove the same amount deposited. Due to the nature of the SOG material, it will tend to accumulate to greater thicknesses in low-lying areas than in higher areas, and thus etch-back will only remove any SOG material remaining on top of the high spots and will remove only a minor amount from the low-lying regions.

A liner, comprising a silicon-rich $SiO_2$ layer, is typically required to shield the devices from moisture. Such a liner is blanket-deposited over the entire wafer and serves as a moisture barrier. The liner is a chemically vapor deposited (CVD) oxide, typically a plasma-enhanced, chemically vapor deposited (PECVD) layer approximately 1,000 Å thick. On the other hand, the thickness of the CVD oxide liner need be only 500 Å if deposited by electron cyclotron resonance (ECR). While either CVD oxide may be used, preferably, the PECVD oxide is used, and the discussion below is directed to the PECVD oxide. It will be understood, however, that the same considerations apply to the ECR CVD oxide.

The silicon-rich $SiO_2$ layer is differentiated from pure $SiO_2$ on the basis of its refractive index. For pure $SiO_2$, the refractive index is about 1.46 to 1.5. In order for a good, reliable SOG layer, the refractive index needs to be greater than 1.6. This is achieved by incorporating more silicon in the $SiO_2$ layer, and the determination of whether sufficient silicon is present is easily made by measurement of the refractive index of the layer.

It is only necessary to guarantee that forming the vias will not etch through the organic SOG material and expose it, in the via. A thin CVD oxide, such as deposited by plasma-enhanced CVD, is used to seal off this layer in the metal spaces. For a typical fabrication scheme, such as disclosed and claimed in a series of U.S. patents issued to Jacob D. Haskell and assigned to the same assignee as the present invention (U.S. Pat. Nos. 4,974,055; 4,977,108; 5,028,555; 5,055,427; 5,057,902; and 5,081,516), the average dielectric constant is about 3.2 if a thin $SiO_2$ liner is used and the siloxane-based SOG is sandwiched in the metal spaces in accordance with the invention.

An inorganic SOG is used to planarize the interlayer dielectric globally. Examples of such inorganic SOGs include silicates and hydrogen silsesquioxane. The material may be Dow Corning "Flowable Oxide" or Tokyo Oka type 7. These are non-etchback type SOGs. The reported dielectric constant of these inorganic SOGs is about 3.2. The maximum amount spun is no more than 6,000 Å on topography wafers, in order to avoid stress cracking. These inorganic SOG layers are tensile by nature, and the total SOG thickness (organic plus inorganic) should not exceed about 1 µm. The PECVD layer between the organic and inorganic SOG layer serves to relieve stress.

The property of the inorganic SOG materials is such that they will all flow to the low-lying areas and leave very little material on the higher area. The exception may be at the big metal pad area (not shown). After curing, another thin PECVD oxide is deposited to seal off the inorganic SOG layer and serve as a moisture barrier. A second inorganic SOG layer/PECVD capping is used again to provide the correct interlayer dielectric thickness, thus providing a layered insulating structure having a low dielectric constant compared to the present state-of-the-art single dielectric material.

The completed structure is depicted in the sole Figure. A silicon substrate 10 supports a first interconnect layer comprising a plurality of metal interconnects 12 separated by a dielectric region 14. The metal interconnects 12 contact doped regions (not shown) in the semiconductor substrate 10. After forming and defining the metal interconnects 12, which typically comprise aluminum or aluminum doped with silicon, titanium, or copper, all exposed regions are first coated with a first PECVD layer 16 of a silicon oxide. It will be seen that the silicon oxide layer 16 coats the bottom of the regions 14 between the metal interconnects 12 (i.e., coating the silicon substrate 10), and the sides and tops of the metal interconnects.

Next, a layer 18 of an organic spin-on-glass material is formed, which partially fills the regions 14 between the metal interconnects 12. Preferably, the organic SOG layer 18 has a thickness that is approximately one-half that of the metal interconnects 12. A second PECVD silicon oxide layer 20 is blanket-deposited on the PECVD-coated metal interconnects 12 and on the organic SOG layer 18. A first inorganic SOG layer 22 is next blanket-deposited on the second PECVD layer 20. A third PECVD silicon oxide layer 24 is then blanket-deposited on the first inorganic SOG layer 22. A second inorganic SOG layer 26 is blanket-deposited on the third PECVD layer 24 for planarization.

A second interconnect layer 28 is then formed and patterned on the second inorganic SOG layer 26, overlying the first layer of metal interconnects 12.

The typical etch-back conditions useful in the practice of the invention include the conventional oxide etch processes optimized for a near 1:1 ratio; that is, etching the SOG at the same rate as the oxide liner layer. And a slightly fast oxide etch rate is preferred for better planarity control. Typical chemistries are $CF_4$, $CHF_3$, Ar, and $O_2$. The amount of etch-back is optimized to clear the SOG from the high spots so as to ensure that no SOG is exposed in the via opening areas.

The dielectric constant is a function of the topography and ranges from 3.36 to 3.46 in the vertical direction and is about 3.2 in the horizontal direction. This provides an RC reduction of between 10 to 15% over the prior art approach, using existing commercially available materials.

For this technology, no new tooling is required and the necessary materials are available now.

The process of the invention employs the best currently available low dielectric constant materials existing and uses them according to their characteristics. Therefore, the integration of these processes is rather cumbersome, owing to the additional number of steps required to form the layered dielectric structure. On the other hand, the materials are not pushed beyond their capability and a comparatively low dielectric structure is obtained.

Industrial Applicability

The layered low-dielectric approach to sub-0.5 micrometer semiconductor technology is expected to find use in silicon processing.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for reducing capacitance between a first layer of metal interconnects in semiconductor devices, said first layer of metal interconnects separated from each other and from a second, overlying layer of metal interconnects for making contact to said first layer of metal interconnects by a dielectric material, said process comprising:

(a) forming a layer of an organic spin-on-glass material filling gaps between metal interconnects in said first layer of metal interconnects;

(b) etching said organic spin-on-glass material back such that said organic spin-on-material is not formed over said metal interconnects in said first layer of metal interconnects;

(c) forming a layer of a chemically vapor deposited oxide on said organic spin-on-glass layer; and (d) forming a layer of an inorganic spin-on-glass material on said chemically vapor deposited oxide to provide planarization to support said second layer of metal interconnects.

2. The process of claim 1 wherein said chemically vapor deposited oxide layers comprise silicon-rich silicon dioxide.

3. The process of claim 2 wherein said chemically vapor deposited oxide layer has a thickness in the range of about 500 to 1,000 Å.

4. The process of claim 1 wherein said organic spin-on-glass material consists essentially of a high carbon-containing siloxane.

5. The process of claim 4 wherein said organic spin-on-glass layer has a thickness that is approximately one-half that of said metal first layer metal interconneet.

6. The process of claim 1 wherein said inorganic spin-on-glass material consists essentially of silicate or hydrogen silsesquioxane.

7. The process of claim 6 wherein said inorganic spin-on-glass layer has a thickness that is less than about 6,000 Å.

8. A process for reducing capacitance between a first layer of metal interconnects in semiconductor devices, said first layer of metal interconnects separated from each other and from a second, overlying layer of metal interconnects for making contact to said first layer of metal interconnects by a dielectric material, said process comprising:

(a) forming a first plasma-enhanced, chemically vapor deposited oxide layer on all exposed metal surfaces of said first metal interconnect layer and exposed semiconductor surfaces to form oxide-coated metal interconnects;

(b) forming an organic spin-on-glass material partially filling spaces between said first layer of metal interconnects and leaving top portions of said oxide-coated metal interconnects exposed;

(c) forming a second plasma-enhanced chemically vapor deposited layer on said top portions of said oxide-coated metal interconnects and on said organic spin-on-glass layer;

(d) forming a first inorganic spin-on-glass layer on said second plasma-enhanced chemically vapor deposited oxide layer;

(e) forming a third plasma-enhanced chemically vapor deposited oxide layer on said first inorganic spin-on-glass layer;

(f) forming a second inorganic spin-on-glass layer on said third plasma-enhanced chemically vapor deposited layer planarization; and (g) forming said second layer of metal interconnects on top of said second inorganic spin-on-glass layer.

9. The process of claim 8 wherein said plasma-enhanced chemically vapor deposited oxide layers comprise silicon-rich silicon dioxide.

10. The process of claim 8 wherein said organic spin-on-glass material consists essentially of a high carbon-containing siloxane.

11. The process of claim 8 wherein said inorganic spin-on-glass material consists essentially of silicate or hydrogen silsesquioxane.

12. The process of claim 4 wherein said high carbon-containing siloxane containing comprises silsesquioxanes having alkyl functionality.

13. The process of claim 8 wherein said organic spin-on-glass material is etched back prior to forming said second plasma-enhanced chemically vapor deposited layer such that said organic spin-on-glass material is not formed on said top portions of said oxide-coated metal interconnects.

14. The process of claim 10 wherein said high carbon-containing siloxane comprises silsesquioxanes having alkyl functionality.

* * * * *